United States Patent
Zhou

(10) Patent No.: US 11,588,051 B2
(45) Date of Patent: Feb. 21, 2023

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/241,750

(22) Filed: Apr. 27, 2021

(65) Prior Publication Data

US 2021/0249533 A1     Aug. 12, 2021

Related U.S. Application Data

(62) Division of application No. 16/559,837, filed on Sep. 4, 2019, now Pat. No. 11,049,973.

(30) Foreign Application Priority Data

Nov. 12, 2018    (CN) .......................... 201811339154.8

(51) Int. Cl.
*H01L 29/06*      (2006.01)
*H01L 29/78*      (2006.01)
(Continued)

(52) U.S. Cl.
CPC ...... *H01L 29/785* (2013.01); *H01L 21/02123* (2013.01); *H01L 21/02532* (2013.01);
(Continued)

(58) Field of Classification Search
CPC ........... H01L 29/0673; H01L 29/42392; H01L 29/78696; H01L 29/66439; H01L 29/775; H01L 29/66545; H01L 21/823807; H01L 29/165; H01L 21/823821; H01L 29/0665; H01L 27/0924; H01L 29/785;
(Continued)

(56) References Cited

U.S. PATENT DOCUMENTS

| 9,653,289 B1 | 5/2017 | Balakrishnan et al. |
| 10,014,390 B1 | 7/2018 | Bouche et al. |

(Continued)

*Primary Examiner* — Samuel Park
(74) *Attorney, Agent, or Firm* — Anova Law Group, PLLC

(57) ABSTRACT

Semiconductor device is provided. The semiconductor device includes a substrate and a fin on the substrate. The fin includes channel layers stacked along a normal direction of a substrate surface. The channel layers includes a first channel layer and a second channel layer under the first channel layer, and the second channel layer has recessed sidewalls with respect to corresponding sidewalls of the first channel layer. The semiconductor device further includes a gate structure, disposed around each of the first channel layer and the second channel layer; and a doped source/drain layer in the fin on two sides of the gate structure. The doped source/drain layer is respectively connected to the second channel layer and the first channel layer.

17 Claims, 5 Drawing Sheets

(51) Int. Cl.
*H01L 21/02* (2006.01)
*H01L 29/66* (2006.01)

(52) U.S. Cl.
CPC .. *H01L 21/02598* (2013.01); *H01L 29/66545* (2013.01); *H01L 29/66795* (2013.01)

(58) Field of Classification Search
CPC ......... H01L 21/02123; H01L 29/66795; H01L 21/02598; H01L 21/02532; H01L 29/6653; H01L 29/6656; H01L 29/1033
See application file for complete search history.

(56) References Cited

U.S. PATENT DOCUMENTS

| | | |
|---|---|---|
| 2016/0268376 A1* | 9/2016 | Shih ..................... H01L 29/775 |
| 2017/0104061 A1 | 4/2017 | Peng et al. |
| 2017/0256609 A1* | 9/2017 | Bhuwalka ....... H01L 21/823456 |
| 2017/0365604 A1 | 12/2017 | Suh et al. |
| 2019/0058052 A1 | 2/2019 | Frougier et al. |
| 2019/0280113 A1 | 9/2019 | Hook et al. |
| 2019/0326288 A1 | 10/2019 | Hashemi et al. |
| 2019/0355723 A1 | 11/2019 | Miao et al. |
| 2020/0006389 A1 | 1/2020 | Huang et al. |
| 2020/0058772 A1* | 2/2020 | Yeh .................... H01L 29/0673 |

* cited by examiner

SEMICONDUCTOR DEVICE AND FABRICATION METHOD THEREOF

CROSS-REFERENCE TO RELATED APPLICATION

This application is a divisional application of U.S. patent application Ser. No. 16/559,837, filed on Sep. 4, 2019, which claims the priority of Chinese Patent Application No. 201811339154.8, filed on Nov. 12, 2018, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

With the rapid development of semiconductor technology, the semiconductor devices present a development trend of high element density and high integration. Currently, the semiconductor devices, as the most basic devices, are widely used. The conventional planar devices have weak control on channel current, which may cause the short-channel effect and leakage current, thereby affecting the electrical performance of the semiconductor devices.

In order to overcome the short-channel effect and control the leakage current, a fin field effect transistor (FinFET), which is a common multi-gate device, has been used in the conventional technology. The structure of the FinFET may include fins and an isolation layer on a semiconductor substrate surface, a gate structure on the surface of the isolation layer and on top surfaces and sidewall surfaces of the fins, and a source region and a drain region in the fin on both sides of the gate structure. The isolation layer may cover a portion of the sidewalls of the fin, and the top surface of the isolation layer may be lower than the top portion of the fin.

However, the semiconductor devices formed by the conventional technology may have poor performance.

SUMMARY

One aspect of the present disclosure provides a method for fabricating a semiconductor device. The method includes:providing a substrate with a fin, where the fin includes a plurality of channel layers stacked along a normal direction of a substrate surface and a sacrificial layer between two adjacent channel layers; forming a dummy gate structure across the fin, covering a portion of a top surface and sidewall surfaces of the fin; forming first grooves in the fin on two sides of the dummy gate structure by at least removing a portion of a channel layer of the plurality of channel layers to form a first channel layer; forming a first protection layer on sidewalls of the first channel layer and sidewalls of the dummy gate structure exposed by the first grooves; after forming the first protection layer, forming second grooves in the fin at bottoms of the first grooves by at least removing a portion of another channel layer of the plurality of channel layers to form an initial second channel layer; removing a portion of sidewalls of the initial second channel layer to form a second channel layer, such that the second channel layer has recessed sidewalls with respect to corresponding sidewalls of the first channel layer covered by the first protection layer; removing the first protection layer after forming the second channel layer; after removing the first protection layer, forming a doped source/drain layer in the first grooves and the second grooves; after forming the doped source/drain layer, forming a dielectric layer, covering the sidewalls of the dummy gate structure, over the substrate and the fin; removing the dummy gate structure and the sacrificial layers covered by the dummy gate structure, thereby forming a gate opening in the dielectric layer between the first channel layer and the second channel layer adjacent to the first channel layer; and forming a gate structure, surrounding the first channel layer and the second channel layer, in the gate opening.

Another aspect of the present disclosure includes a semiconductor device fabricated by embodiments of the present disclosure. The semiconductor device includes a substrate, a fin on the substrate, where the fin includes channel layers stacked along a normal direction of a substrate surface, where the channel layers includes a first channel layer and a second channel layer under the first channel layer, and the second channel layer has recessed sidewalls with respect to corresponding sidewalls of the first channel layer; a gate structure, disposed around each of the first channel layer and the second channel layer; and a doped source/drain layer in the fin on two sides of the gate structure, where the doped source/drain layer is respectively connected to the second channel layer and the first channel layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes providing a substrate with a fin including a plurality of channel layers and a sacrificial layer; forming a dummy gate structure across the fin; forming first grooves in the fin on two sides of the dummy gate structure; forming a first protection layer on sidewalls of the first channel layer and the dummy gate structure; forming second grooves by etching the fin at bottoms of the first grooves; removing a portion of sidewalls of the initial second channel layer to form a second channel layer; removing the first protection layer; forming a doped source/drain layer in the first grooves and the second grooves; forming a dielectric layer over the substrate and the fin; removing the dummy gate structure and the sacrificial layers to form a gate opening; and forming a gate structure in the gate opening.

Figure 1:
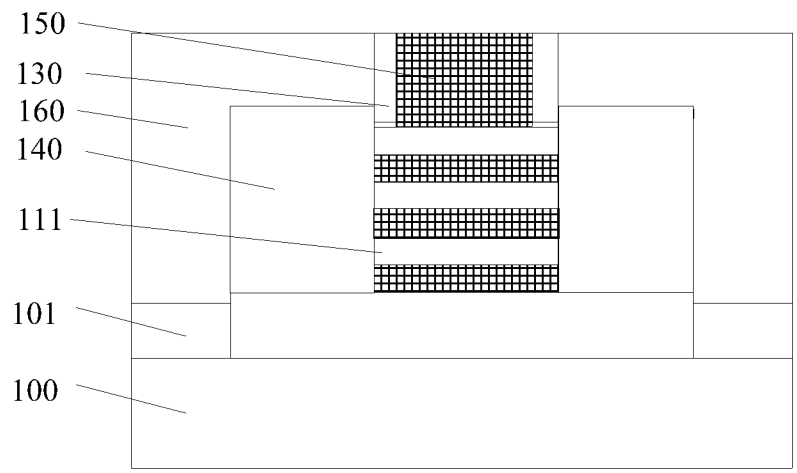
FIG. 1 illustrates a structural schematic corresponding to a semiconductor device.

Referring to FIG. 1, a semiconductor device may include: a substrate 100; a fin on the substrate 100, where the fin may include a plurality of first channel layers 111 stacked along a normal direction of a surface of the semiconductor substrate; an isolation structure 101, covering a portion of sidewalls of the fin, on the surface of the substrate; a gate structure 150 on the fin, where the gate structure 150 may surround the first channel layers 111; spacers 130 on the sidewalls of the gate structure 150; a doped source/drain layer 140 on both sides of the gate structure; a dielectric layer 160 over the substrate 100 and the fin, where the dielectric layer 160 may cover the sidewalls of the gate structure 150, sidewalls and a top surface of the doped source/drain layer, and may expose a top surface of the gate structure 150.

In the above-mentioned semiconductor device, the doped source/drain layer itself has a bulk resistance. When a source/drain voltage is applied to the doped source/drain layer, the voltage drop across the doped source/drain layer itself may be increased, and the potential generated by the source/drain voltage may be reduced continuously along a direction from the top to the bottom of the fin. The doped source/drain layer may be connected to each first channel layer, so the potential generated by the source/drain voltage of each first channel layer may be reduced sequentially along the direction from the top to the bottom of the fin. A size of each first channel layer is same, so a channel threshold voltage in each first channel layer may be same, and a voltage difference between the source/drain voltage of each first channel layer and the threshold voltage may be reduced sequentially along the direction from the top to the bottom of the fin. The larger voltage difference between the source/drain voltage and the threshold voltage is, the higher carrier density of the channel is. Therefore, the carrier density of each channel along the direction from the top to the bottom of the fin may be reduced sequentially and the current density generated by each channel may be also reduced sequentially. In such way, the uneven current density may result in poor reliability and performance of the semiconductor device.

In one embodiment of the present disclosure, channel regions with different lengths may be formed, where the channel size near the fin top may be larger and the channel size near the fin bottom may be smaller. In such way, the potential difference at two ends of the channel region along the direction from the top to the bottom of the fin may be same, and the current density in each channel region may be same, which may improve the performance of the semiconductor device.

FIGS. 2-13 illustrate structural schematics corresponding to certain stages for forming an exemplary semiconductor device according to various disclosed embodiments of the present disclosure. FIG. 14 illustrates a flowchart of an exemplary fabrication method for forming a semiconductor structure according to various disclosed embodiments of the present disclosure.

Figure 2:
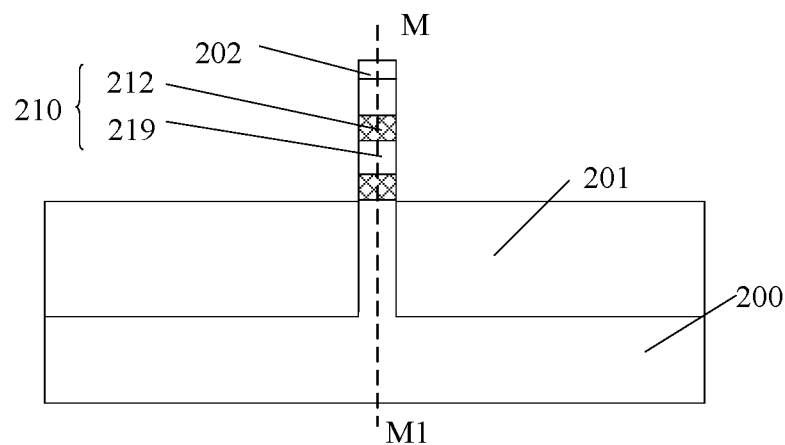
FIGS. 2-13 illustrate structural schematics corresponding to certain stages for forming an exemplary semiconductor device according to various disclosed embodiments of the present disclosure.

Referring to FIG. 2, a substrate may be provided. The substrate may include a semiconductor substrate 200 and a fin 210 on the semiconductor substrate 200. The fin 210 may include a plurality of channel layers 219 stacked along a normal direction of the substrate surface and sacrificial layers 212 where each sacrificial layer may be between two adjacent channel layers 219 (e.g., in S401 of FIG. 14).

The semiconductor substrate 200 may be made of a material including monocrystalline silicon, polycrystalline silicon or amorphous silicon. The semiconductor substrate 200 may also be made of a material including silicon, germanium, silicon germanium, gallium arsenide or any other suitable materials. In one embodiment, the material of the semiconductor substrate 200 is monocrystalline silicon.

The method for forming the fin 210 may include: forming a fin material film on the semiconductor substrate, where the fin material film may include a plurality of first fin films (not shown) stacked along the normal direction of the semiconductor substrate surface and may also include second fin films (not shown) where each second fin film may be between two adjacent first fin films; forming a patterned layer (not shown) on the fin material film; using the patterned layer as a mask, etching the fin material film to form the fin 210, and forming the channel layers 219 from the first fin films and forming the sacrificial layers 212 from the second fin films.

The material of the channel layer 219 may be different from the material of the sacrificial layer 212. For example, the channel layer 219 may be made of a material including monocystalline silicon or monocystalline germanium silicon. The sacrificial layer 212 may be made of a material including monocystalline silicon or monocystalline germanium silicon.

The top of the fin 210 may have a fin protection layer 202.

The fin protection layer 202 may be made of a material including silicon nitride, silicon oxynitride, silicon oxycarbonitride, silicon oxyboronitride, and silicon oxyborocarbonitride.

Referring to FIG. 2, an isolation structure 201 may be formed on the semiconductor substrate 200 and may cover a portion of sidewalls of the fin 210.

The isolation structure 201 may be used to isolate different types of the semiconductor devices.

The isolation structure 201 may be made of a material including silicon oxide.

The method for forming the isolation structure 201 may include: forming an isolation structure film (not shown) covering the fin 210 on the semiconductor substrate 200; and etching back the isolation structure film to form the isolation structure 201.

The isolation structure film may be formed by a deposition process such as a fluid chemical vapor deposition process. The fluid chemical vapor deposition process may be used to form the isolation structure film, so the isolation structure film may have a better filling performance.

Figure 3:
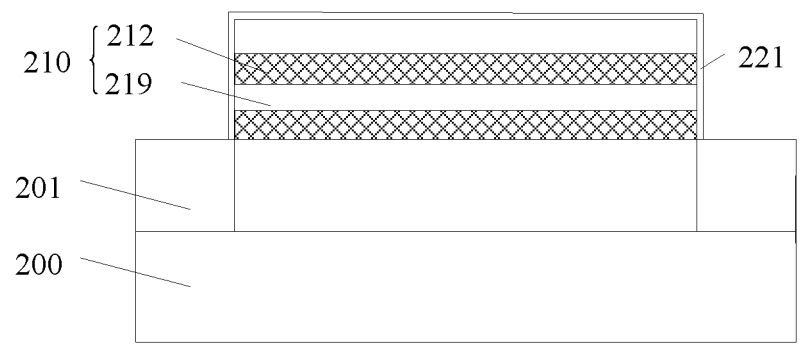
Figure 4:
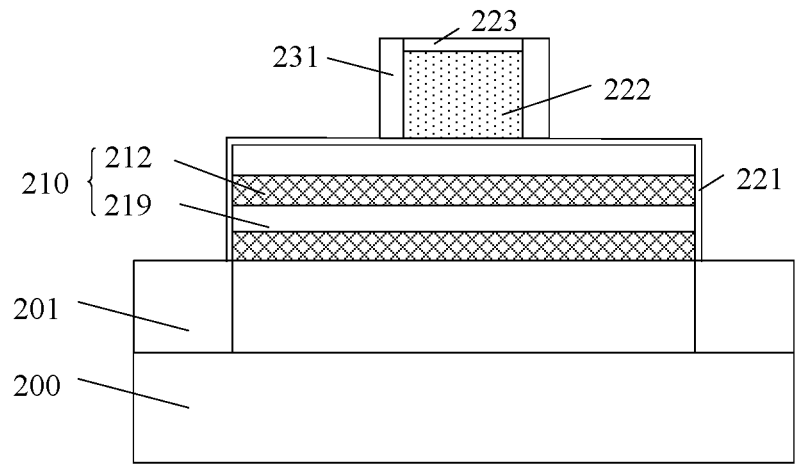

A dummy gate structure across the fin 210 may be formed. The dummy gate structure may cover a portion of the top surface and sidewall surfaces of the fin 210. The dummy gate structure may include a dummy gate dielectric layer and a dummy gate electrode layer. FIGS. 3-4 may illustrate the formation method of the dummy gate structure in detail.

Referring to FIG. 3, FIG. 3 illustrates a cross-sectional view along a M-M1 line in FIG. 2. After forming the isolation structure 201, the fin protection layer 202 on the top of the fin 210 may be removed, and a dummy gate dielectric layer 221 may be formed on the surface of the fin 210.

The dummy gate dielectric layer 221 may provide a material layer for subsequently forming the dummy gate structure.

The material of the dummy gate dielectric layer 221 may be silicon oxide.

In one embodiment, the dummy gate dielectric layer 221 may be formed by an in-situ stream generation process (ISSG). The dummy gate dielectric layer 221 formed by the in-situ stream generation process may have an excellent step coverage capability. In such way, the formed dummy gate dielectric layer 221 may firmly cover the sidewall surfaces of the fin 210, and a thickness of the formed gate dielectric layer 221 may be uniform.

In one embodiment, the dummy gate dielectric layer 221 may be formed by a chemical oxidation process. The chemical oxidation process may include oxidizing the exposed sidewalls and the top surface of the fin 210 using an aqueous ozone solution to form the dummy gate dielectric layer 221.

Referring to FIG. 4, after forming the dummy gate dielectric layer 221, a dummy gate electrode layer 222 may be formed on a surface of the dummy gate dielectric layer 221. The dummy gate electrode layer 222 may cover the portion of the top surface and the sidewall surfaces of the fin 210 (e.g., in S402 of FIG. 14).

The method for forming the dummy gate electrode layer 222 may include: forming a dummy gate film (not shown), which covers the fin 210, on the substrate 200 and the fin 210; forming a mask layer on the dummy gate film where the mask layer may expose a portion of a dummy gate film surface; using the mask layer as a mask, etching the dummy gate film till exposing the dummy gate dielectric layer 221 on the fin 210 and forming the dummy gate electrode layer 222 on the fin 210.

The dummy gate structure may include the dummy gate dielectric layer 221 crossing the fin 210 and the dummy gate electrode layer 222 on the dummy gate dielectric layer 221. For example, the dummy gate dielectric layer 221 may cover the top surface and the sidewall surfaces of the fin 210.

In one embodiment, the material of the dummy gate electrode layer 222 may be polycrystalline silicon.

The dummy gate structure may further include a dummy gate protection layer 223 on a surface of the dummy gate electrode layer 222. The gate protection layer 223 may protect the dummy gate electrode layer 222 when subsequently forming the doped source/drain layer, and may be used as a stop layer for subsequently planarizing the dielectric layer.

The dummy gate protection layer 223 may be made of a material including silicon oxide or silicon nitride.

In one embodiment, after forming the dummy gate structure, spacers 231 may be formed on the sidewalls of the dummy gate structure. The spacers 231 may cover the sidewalls of the dummy gate electrode layer 222 and the dummy gate protection layer 223.

The spacers 231 may be used to define a position of the doped source/drain layer formed subsequently, and may be used to protect the sidewalls of the dummy gate electrode layer 222, which may avoid defective morphology of a gate electrode layer formed subsequently, thereby affecting the electrical property of the semiconductor device.

The forming process of the spacers 231 may include: forming a spacer material layer (not shown) on the dummy gate dielectric layer 221 and the dummy gate structure, where the spacer material layer may cover the portion of the sidewall surfaces and the top surface of the fin 210, the sidewalls of the dummy gate electrode layer 222, and the sidewalls and the top surface of the dummy gate protection layer 223; etching back the spacer material layer till exposing the top surfaces of the dummy gate dielectric layer 221 and the dummy gate protection layer 223, and forming the spacers 231, which may cover the sidewalls of the dummy gate electrode layer 222 and the sidewalls of the dummy gate protection layer 223, on the dummy gate dielectric layer 221.

The forming process of the spacer material layer may be one or a combination of a chemical vapor deposition process, a physical vapor deposition process or an atomic layer deposition process. The spacers 231 may be made of a material including silicon oxide, silicon nitride, silicon oxynitride, silicon oxycarbide, silicon carbonitride or silicon oxycarbonitride.

In one embodiment, the spacers 231 may be made of a material including silicon nitride.

In one embodiment, the spacers 231 may include a first spacer and a second spacer. The first spacer may be on the sidewalls of the dummy gate electrode layer 222 and the dummy protection layer 223. The second spacer may be on a sidewall of the first spacer. The first spacer may be used to define a position of a lightly doped region, and the first spacer and the second spacer may be used to define the position of the doped source/drain layer.

The dummy gate dielectric layer 221 may protect the fin 210 on two sides of the spacers when etching back the spacer material layer.

Figure 5:
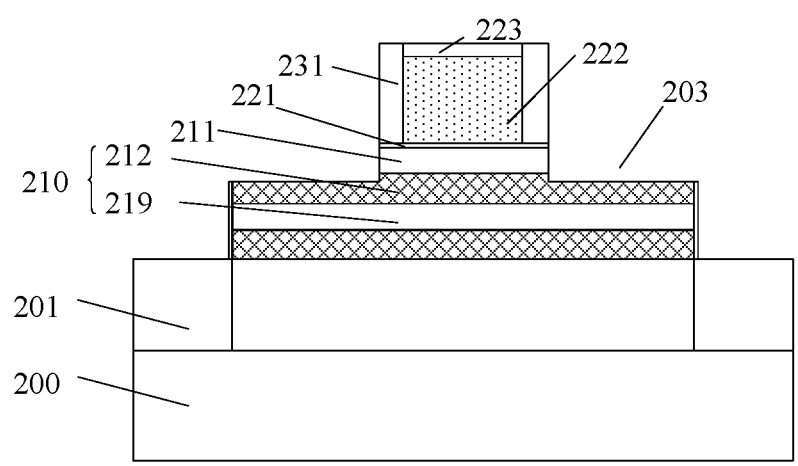

Referring to FIG. 5, after forming the dummy gate structure, first grooves 203 may be formed in the fin 210 on two sides of the dummy gate structure. The first grooves 203 may expose a portion of the sidewalls of the first channel layer 211 (e.g., in S403 of FIG. 14).

For example, using the dummy gate structure and the spacers 231 as a mask, a portion of the fin 210 on two sides of the dummy gate structure may be etched to form the first grooves 203.

The first grooves may provide space for the subsequent formation of the doped source/drain layer.

The portion of the fin 210 on two sides of the dummy gate structure may be removed by an anisotropic dry etching process. The parameters of the dry etching process may include an etching gas including HBr and Ar, where a flow rate of HBr may be about 10 sccm to about 1000 sccm, and a flow rate of the Ar may be about 10 sccm to about 1000 sccm.

The dummy gate protection layer 223 may protect the dummy gate electrode layer 222 when etching the dummy gate structure and the fin 210 on two sides of the spacers 231.

A size of the first channel layer 211 between the first grooves 203 may be about 20 nm to about 44 nm.

A depth of the first grooves 203 may be about 50 nm to about 250 nm.

The depth of the first grooves 203 may determine a thickness of the doped source/drain layer subsequently formed in the first grooves, and the thickness of the doped source/drain layer may determine the bulk resistance of the doped source/drain layer, thereby determining the divided voltage of the doped source/drain layer.

The sum of the depth of the first grooves 203 and a depth of a formed subsequently second grooves may be fixed. If the depth of the first grooves 203 is too large, the thickness of the doped source/drain layer formed subsequently may be relatively large. Furthermore, a source/drain voltage of the channel layers 219 at bottoms of the first grooves 203 may be relatively small, and a threshold voltage of the channel between the first grooves 203 may be same. Therefore, voltage differences between the source/drain voltages and the threshold voltages of the channel layers 219 between the first grooves 203 may be different; and a current density generated by each channel layer 219 between the first grooves 203 may be different, which may result in poor performance of the semiconductor device.

If the depth of the first grooves 203 is too small, the depth of the doped source/drain layer formed subsequently may be too large, and a current density generated by each channel in each channel layer 219 between the first grooves 203 may not be uniform, which may result in poor performance of the semiconductor device.

Figure 6:
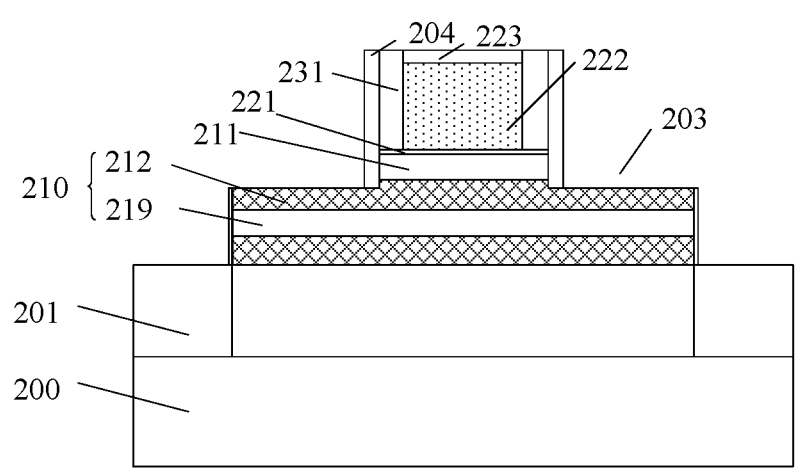

Referring to FIG. 6, after forming the first grooves 203, a first protection layer 204 may be formed on the sidewalls of the fin 210 and the sidewalls of the dummy gate structure, which are exposed by the first grooves 203 (e.g., in S404 of FIG. 14).

In one embodiment, the first protection layer 204 may cover the sidewalls of the spacers 231 on the sidewalls of the dummy gate structure.

The first protection layer 204 may cover the sidewalls of the first channel layer 211 exposed by the first grooves 203.

The first protection layer 204 may protect the first channel layer 211 exposed by the first grooves 203 during the subsequent formation of a second channel layer.

The first protection layer 204 may be made of a material including silicon oxide, silicon nitride, silicon oxynitride, silicon oxycarbide, silicon carbonitride or silicon oxycarbonitride.

The method for forming the first protection layer 204 may include: forming a first initial protection layer (not shown) in the first grooves 203 and on the dummy gate structure, where the first initial protection layer may cover the sidewalls of the fin exposed by the first grooves 203; and etching back the first initial protection layer till exposing the fin surface at the bottoms of the first grooves 203, and forming the first protection layer 204 on the sidewalls of the fin 210 and the sidewalls of the dummy gate structure, which are exposed by the first grooves 203.

The forming process of the first protection layer may be one or a combination of a chemical vapor deposition process, a physical vapor deposition process or an atomic layer deposition process.

Figure 7:
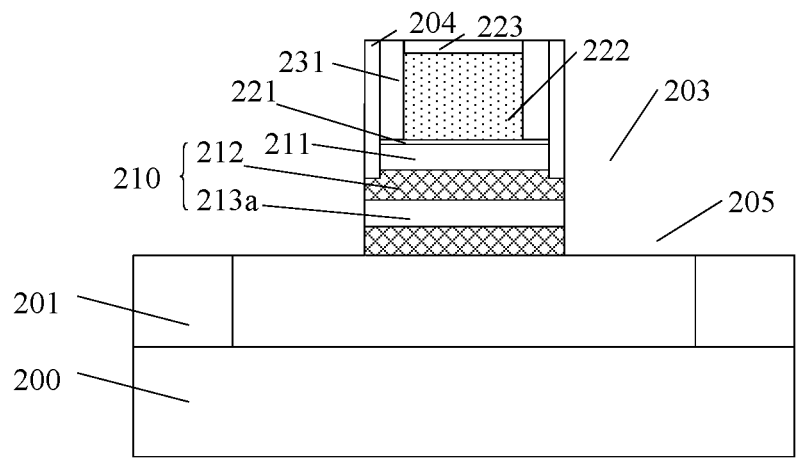

Referring to FIG. 7, second grooves 205 may be formed by etching the fin 210 at bottoms of the first grooves 203. The second grooves 205 may expose a portion of the sidewalls of an initial second channel layer 213a (e.g., in S405 of FIG. 14).

For example, using the dummy gate structure and the first protection layer 204 as a mask, the fin 210 at the bottoms of the first grooves 203 may be etched to form the second grooves 205 at the bottoms of the first grooves 203.

The second grooves 205 may provide space for subsequently forming the doped source/drain layer.

A ratio between the depth of the first grooves 203 and a depth of the second grooves 205 may be about 1:1.4 to about 1:3.

The depth of the second grooves 205 may be about 150 nm to about 350 nm.

If the depth of the second grooves is too big, a channel current density of each initial second channel layer between the second grooves may not be uniform, which may result in poor performance of the semiconductor device.

Figure 8:
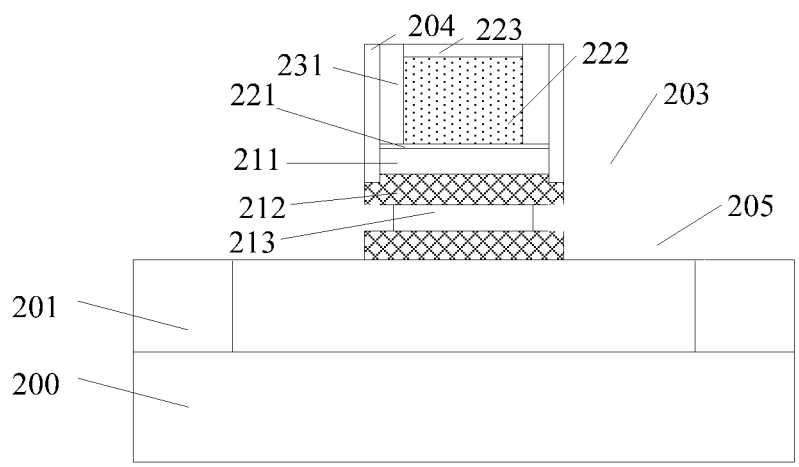

Referring to FIG. 8, after forming the second grooves 205, a portion of the initial second channel layer 213a of the sidewalls of the second grooves 205 may be removed to form a second channel layer 213. Sidewalls of the second channel layer 213 may be recessed with respect to the sidewalls of the first channel layer 211 (e.g., in S406 of FIG. 14).

The second channel layer 213 may be a subsequent channel of the doped source/drain layer in the second grooves 205, so a size of the second channel layer 213 between the second grooves 205 may determine a channel length of the doped source/drain layer in the second grooves 205.

The portion of the initial second channel layer 213a may be removed by a wet etching process. An etching solution of the wet etching process may have a good selectivity of silicon and silicon germanium, which may ensure the silicon germanium morphology is not affected while removing the silicon. In one embodiment, the parameters of the wet etching process may include: an etching solution which is a tetramethylammonium hydroxide solution, a temperature of about 20 degrees Celsius to about 80 degrees Celsius, and the volume percentage of the tetramethylammonium hydroxide solution of about 10% to about 80%.

In one embodiment, the material of the initial second channel layer 213a may be silicon and the material of the sacrificial layer 212 may be silicon germanium. The tetramethylammonium hydroxide etching solution may have a good selectivity.

A distance between the sidewall of the second channel layer 213 and the sidewall of the first channel layer 211 may be about 1 nm to about 4 nm.

A size of the second channel layer between the second grooves along a channel length direction may be about 16 nm to about 38 nm.

A size of the first channel layer between the first grooves along a channel length direction may be about 20 nm to about 44 nm.

The sidewall of the second channel layer 213 may be convex or coplanar with the sidewall of the dummy gate electrode layer 222.

When the size of the second channel layer 213 is less than the size of the dummy gate electrode layer 222, a channel distance of the subsequently formed semiconductor device may be shorter and the carrier channel may be smaller, so the semiconductor device may have poor performance. When the size of the second channel layer 213 is too large, the effect of improving the carrier density may be poor.

The size of the first channel layer 211 between the first grooves 203 in the channel length direction may be larger than the size of the second channel layer 213 between the second grooves 205 in the channel length direction. The smaller the channel size is, the smaller the threshold voltage for turning on the channel is. Therefore, the channel threshold voltage on the second channel layer 213 may be less than the channel threshold voltage on the first channel layer 211. The first channel layer 211 may be over the second channel layer 213. When a source/drain voltage is applied to a doped source/drain layer 250, the source/drain voltage on the first channel layer 211 may be greater than the source/drain voltage on the second channel layer 213. By appropriately adjusting the size of the second channel layer 213, a voltage difference between the source/drain voltage and the threshold voltage on the first channel layer 211 may be equal to a voltage difference between the source/drain voltage and the threshold voltage on the second channel layer 213. Therefore, the channel carrier density in the first channel layer 211 and the channel carrier density in the second channel layer 213 may be same, and the current density generated by each channel may be same, thereby improving the performance of the semiconductor device.

In order to better adjust the carrier density of each channel region, the size of each channel layer along a direction from the top to the bottom of the fin may be reduced sequentially, thereby better balancing the current density of the channel region and improving the performance of the semiconductor device.

In one embodiment, after removing the first protection layer and before forming the doped source/drain layer, a correction process may be performed to form a third channel layer. The correction process may include: forming a second protection layer on the fin sidewalls exposed by the first grooves and the second grooves and the sidewalls of the dummy gate structure; forming third grooves in the fin at the bottoms of the second grooves, where the third grooves may expose a portion of the sidewall of the first channel layer; forming a third channel layer by removing a portion of the channel layer on the sidewall of the third grooves, where the sidewall of the third channel layer may be recessed with respect to the sidewall of the second channel layer exposed by the second grooves; and removing the second protection layer after forming the third channel layer.

In one embodiment, after removing the first protection layer and before forming the doped source/drain layer, a plurality of correction processes may be performed to form the third channel layer, and a length of the third channel layer along a direction parallel to the substrate surface may be less than a length of an adjacent upper first or second channel layer.

The length of the third channel layer along the direction parallel to the substrate surface may be the channel length between the doped source/drain layers on two sides of the gate structure.

Figure 9:
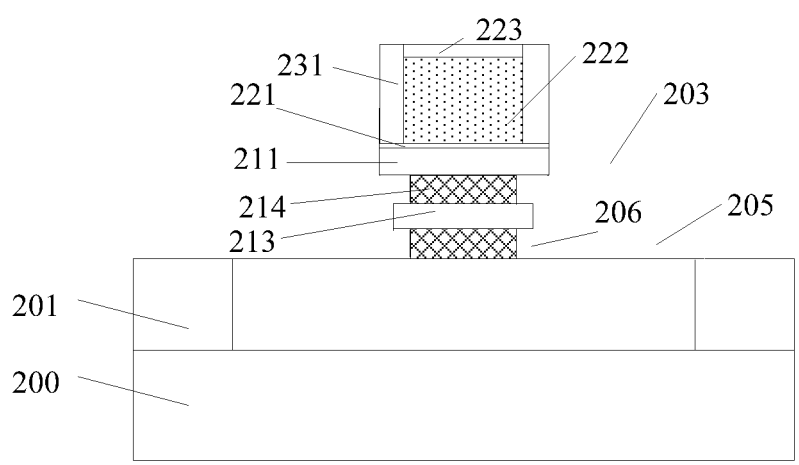

Referring to FIG. 9, after forming the second channel layer 213, the first protection layer 204 may be removed to expose the sidewalls of the first channel layer 211 (e.g., in S407 of FIG. 14).

In one embodiment, after removing the first protection layer 204, the fabrication method may further include: forming a first sacrificial layer 214 by removing a portion of the sacrificial layers 212 exposed by the first grooves 203 and the second grooves 205; and forming first fin recesses 206 between the first channel layer 211 and the second channel layer 213 adjacent to the first channel layer 211. The sidewall of the first sacrificial layer 214 may be recessed with respect to the sidewall of the second channel layer 213.

The first fin recesses 206 may provide space for the isolation layer subsequently formed.

A size of the first sacrificial layer 214 may be about 30 nm to about 60 nm.

A width of the first sacrificial layer 214 may be less than a width of the dummy gate electrode layer 222. The channel length of the subsequently formed semiconductor device may be smaller, so the carrier channel may be smaller and the semiconductor device may have poor performance. When the width of the first sacrificial layer 214 is too large, the length of the isolation layer formed subsequently may be shorter, and a size between the gate electrode layer and the doped source/drain layer formed subsequently may be relatively short, so the parasitic capacitance between the gate layer and the doped source/drain layer may be relatively large.

The portion of the sacrificial layers 212 may be removed by a wet etching process. The web etching solution may have a good selectivity of silicon and silicon germanium which may ensure the silicon morphology is not affected while removing the silicon germanium. In one embodiment, the parameters of the wet etching process may include: an etching solution containing HCl gas, a temperature of about 25 degrees Celsius to about 300 degrees Celsius, and the volume percentage of the etching solution containing HCl of about 20% to about 90%.

In one embodiment, the material of the first channel layer may be silicon and the material of the sacrificial layer may be silicon germanium. In such way, the etching HCl solution may have a good selectivity.

Figure 10:
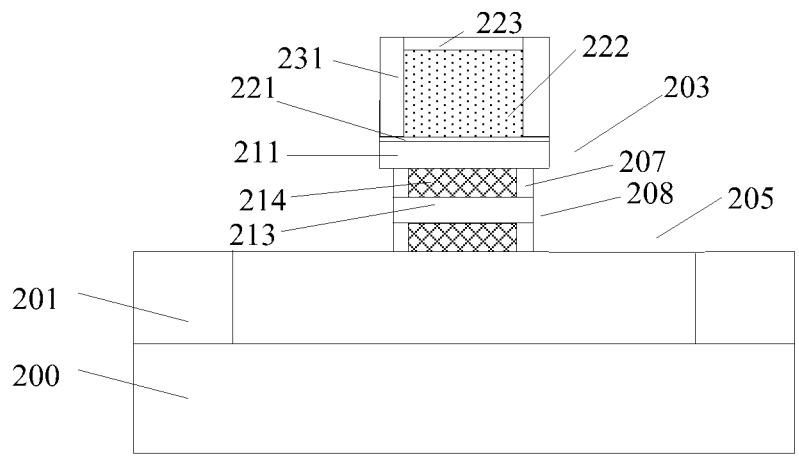

Referring to FIG. 10, an isolation layer 207 may be formed in the first fin recesses 206, and a sidewall of the isolation layer 207 may be coplanar with the sidewall of the second channel layer 213.

The isolation layer 207 may be used to increase the distance between the doped source/drain layer and the gate structure formed subsequently, and reduce the parasitic capacitance between the doped source/drain layer and the gate structure.

The isolation layer 207 may be made of a material including silicon nitride, silicon oxynitride, silicon oxycarbide, silicon carbonitride or silicon oxycarbonitride.

The method for forming of the isolation layer 207 may include: forming an initial isolation layer (not shown) on the dummy gate structure and the fin 210, where the initial isolation layer may cover the sidewalls and the top surface of the dummy gate structure, the sidewalls of the fin 210 exposed by the first grooves 203, the sidewalls of the fin and the surface of the fin 210 at the bottoms of the second grooves 205, which are exposed by the second grooves 205; removing a portion of the initial isolation layer till exposing the sidewalls of the dummy gate structure, the sidewalls of the first channel layer 211, the sidewalls of the second channel layer 213, and the surfaces of the fin 210 at the bottoms of the second grooves 205, and forming the isolation layer 207 in the first fin recesses 206.

In one embodiment, when forming the isolation layer 207, second fin recesses 208 may be formed. The second fin recesses may be between the first channel layer and the fin at the bottoms of the second grooves.

The second fin recesses 208 may provide space for the doped source/drain layer formed subsequently.

The initial isolation layer may be formed by one or a combination of a chemical vapor deposition process, a physical vapor deposition process or an atomic layer deposition process.

The process for removing initial isolation layer may include an isotropic dry etching process or an isotropic wet etching process.

In one embodiment, the portion of the initial isolation layer may be removed by an isotropic dry etching process. The parameters of the isotropic dry etching process may include: gases including $CF_4$, $CH_3F$ and $O_2$, a flow rate of $CF_4$ of about 5 sccm to about 100 sccm, a flow rate of $CH_3F$ of about 8 sccm to about 50 sccm, a flow rate of 02 of about 10 sccm to about 100 sccm, a chamber pressure of about 10 mtorr to about 2000 mtorr, a radio frequency power of about 50 W to about 300 W, a bias voltage of about 30 V to about 100 V, and a time duration of about 4 s to about 50 s.

In other embodiments, the method for removing the portion of the initial isolation layer may include: etching back the initial isolation layer to expose the portion of the bottom surfaces of the second grooves; etching and removing the portion of the initial isolation layer till exposing the sidewalls of the dummy gate structure, the sidewalls of the first channel layer and the sidewalls of the second channel layer to form the isolation layer.

Figure 11:
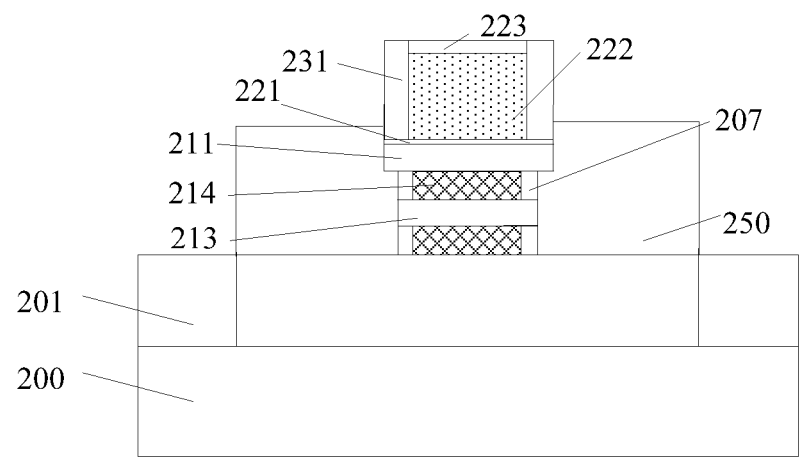

Referring to FIG. 11, the doped source/drain layer 250 may be formed in the first grooves 203 and the second grooves 205 (e.g., in S408 of FIG. 14).

In one embodiment, the doped source/drain layer 250 may also be in the second fin recesses 208. The doped source/drain layer 250 may cover the sidewalls of each of the first channel layer 211, the second channel layer 213 and the isolation layer 207.

The doped source/drain layer 250 may have source/drain dopant ions.

The doped source/drain layer 250 may be formed by an epitaxial growth process. The process of doping the source/drain dopant ions in the doped source/drain layer may be an in-situ doping process.

When the semiconductor device is a P-type device, the doped source/drain layer 250 may be made of a material including silicon, germanium or silicon germanium. The source/drain dopant ions may be P-type ions including boron ions, BF' ions or indium ions. When the semiconductor device is a N-type device, the doped source/drain layer 250 may be made of a material including silicon, gallium arsenide or indium gallium arsenide. The source/drain dopant ions may be N-type ions including phosphorus ions or arsenic ions.

In one embodiment, when the semiconductor device is a P-type device, the material of the doped source/drain layer 250 may be silicon, and the source/drain dopant ions may be boron ions. When the semiconductor device is a N-type device, the material of the doped source/drain layer 250 may be silicon, and the source/drain dopant ions may be phosphorus ions.

The doped source/drain layer 250 may be connected to the first channel layer 211 and the second channel layer 213.

In one embodiment, the doped source/drain layer may be formed in the first grooves, the second grooves and the third grooves. The doped source/drain layer may be connected to the first channel layer, the second channel layer and the third channel layer.

The first channel layer 211 may be above the second channel layer 213. When a source/drain voltage is applied to the doped source/drain layer 250, the source/drain voltage on the first channel layer 211 may be larger than the source/drain voltage on the second channel layer 213, and the channel threshold voltage in the second channel layer 213 may be less than the channel threshold voltage in the first channel layer 211. By appropriately adjusting the size of the second channel layer 213, a voltage difference between the source/drain voltage and the threshold voltage on the first channel layer 211 may be equal to a voltage difference between the source/drain voltage and the threshold voltage on the second channel layer 213. Therefore, the channel carrier density in the first channel layer 211 and the channel carrier density in the second channel layer 213 may be same, and the current density generated by each channel may be same, thereby improving the performance of the semiconductor device.

Figure 12:
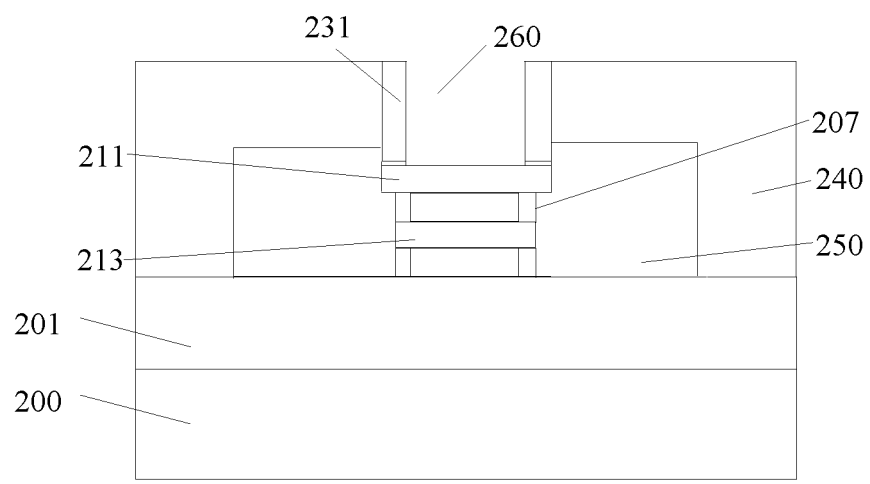

Referring to FIG. 12, after forming the doped source/drain layer 250, a dielectric layer 240 may be formed over the semiconductor substrate 200, the isolation structure 201 and the fin 210, and may cover the sidewalls of the dummy gate structure and expose the top surface of the dummy gate structure (e.g., in S409 of FIG. 14). After forming the dielectric layer 240, the dummy gate structure and the first sacrificial layer 214 covering the dummy gate structure may be removed, and a gate opening 260 may be formed in the dielectric layer 240 (e.g., in S410 of FIG. 14).

The gate opening may be surrounding the first channel layer 211 and the second channel layer 213.

The dielectric layer 240 may be made of a material including silicon oxide.

The method for forming the dielectric layer 240 may include: forming a dielectric material film (not shown) over the semiconductor substrate 200, the isolation structure 201 and the fin 210, and may cover the top surface of the dummy gate structure; and planarizing the dielectric material layer till exposing the top surface of the dummy gate structure to form the dielectric layer 240.

The dielectric material film may be made by a deposition process such as a plasma chemical vapor deposition process or a fluid chemical vapor deposition process. The dielectric material film may be planarized by a chemical mechanical polishing process or an etching back process.

Removing the dummy gate structure and the first sacrificial layer 214 covering the dummy gate structure may include: removing the dummy gate electrode layer 222 and the dummy gate dielectric layer 221 exposed by removing the dummy gate electrode layer 222, and forming an initial gate opening (not shown) in the dielectric layer 240; and removing the first sacrificial layer 214 exposed by the initial gate opening to form the gate opening 260 from the initial gate opening.

The first sacrificial layer 214 exposed by the initial gate opening may be removed by a dry etching process.

In one embodiment, the material of the first channel layer 211 may be monocrystalline silicon, and the material of the first sacrificial layer 214 may be monocrystalline germanium silicon. The first sacrificial layer 214 exposed by the initial gate opening may be removed by a dry etching process, where the process parameters may include: a total used gas including an etching gas and a diluent gas, the etching gas including HCl, the diluent gas including $N_2$, a molar percentage of the etching gas to the total gas which is about 20% to about 90%, and a temperature of about 100 degrees Celsius to about 200 degrees Celsius (e.g., 150 degrees Celsius).

In the dry etching process used to remove the first sacrificial layer 214 exposed by the initial gate opening, the etching gas may include HCl gas. HCl gas may have a better chemical reactivity, and the reaction rate between the HCl and the first sacrificial layer 214 may be relatively fast, so the etching selectivity of the first sacrificial layer 214 with respect to the first channel layer 211 in the dry etching process may be relatively large.

In one embodiment, the gate opening may be between adjacent additional third channel layers and may also be between the first channel layer and the second channel layer adjacent to the first channel layer, and between the second channel layer and the third channel layer adjacent to the second channel layer.

Figure 13:
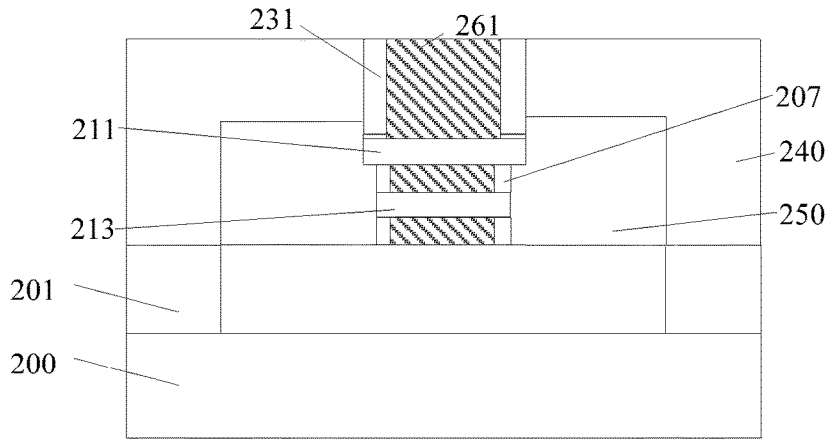
Figure 14:
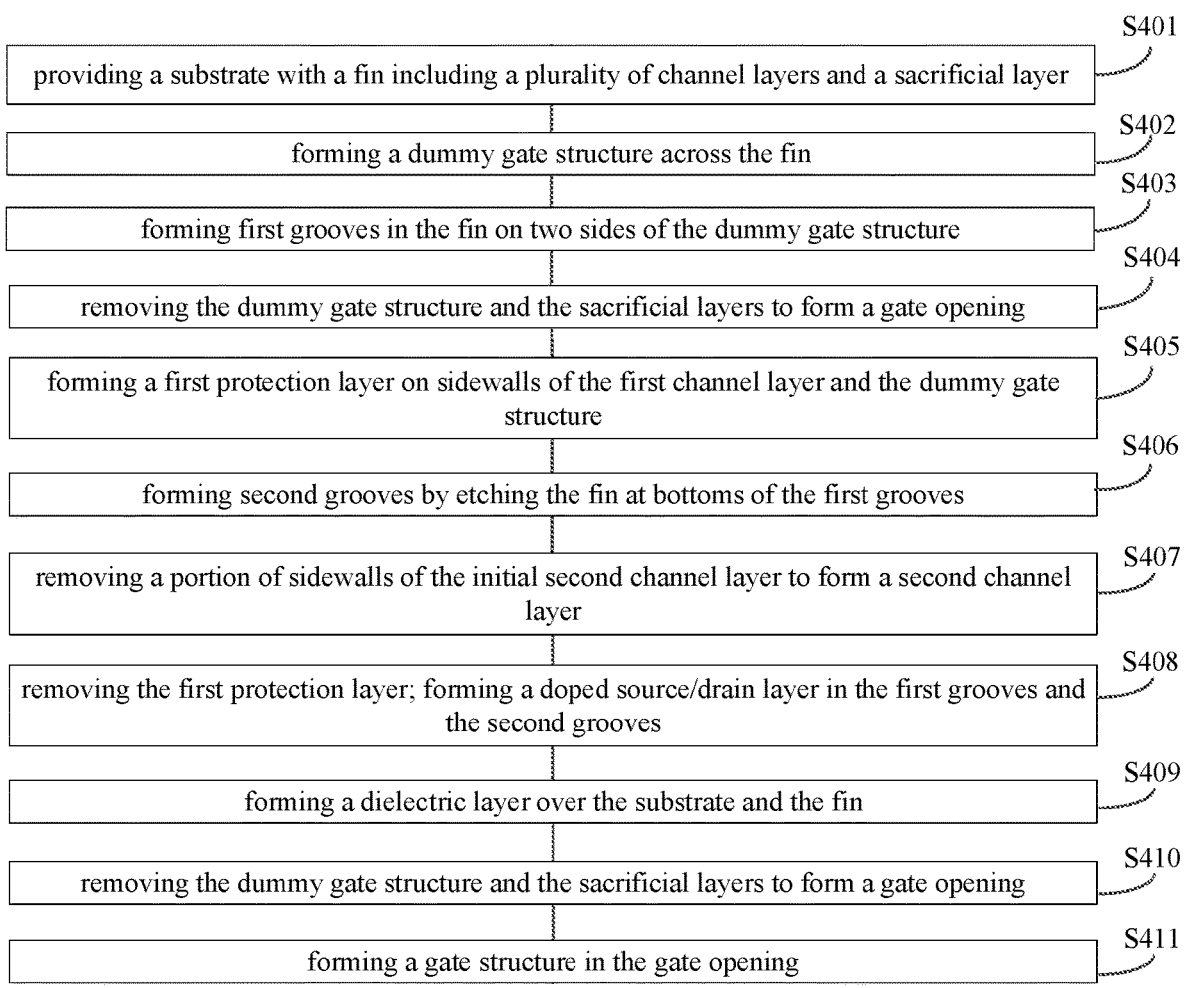
FIG. 14 illustrates a flowchart of an exemplary fabrication method for forming a semiconductor structure according to various disclosed embodiments of the present disclosure.

Referring to FIG. 13, after forming the gate opening 260, a gate structure 261 may be formed in the gate opening 260. The gate structure 261 may be surrounding the first channel layer 211 and the second channel layer 213 (e.g., in S411 of FIG. 14).

The gate structure 216 may be formed in the gate opening 260. The gate structure may surround the first channel layer 211 ant the second channel layer 213.

In one embodiment, the gate structure may be surrounding the first channel layer, the second channel layer and the third channel layer. The gate structure may also between the first channel layer and the second channel layer adjacent to the first channel layer, and between the second channel layer and the third channel layer adjacent to the second channel layer. The gate structure may surround the first channel layer, the second channel layer, and the third channel layer.

In such way, the gate structure 261 may surround the first channel layer 211 and the second channel layer 213, which may increase the ability of the gate structure 261 to control the channel.

The gate structure 261 may include a gate dielectric layer (not shown) surrounding the first channel layer 211 and the second channel layer 213, and a gate electrode layer (not shown) covering the gate dielectric layer. For example, the gate dielectric layer may be on the sidewalls and the bottom of the gate opening 260. The gate dielectric layer may surround the first channel layer 211 and the second channel layer 213, and the gate electrode layer may cover the gate dielectric layer.

In one embodiment, the gate dielectric layer may be made of a high-k dielectric material (dielectric coefficient greater than 3.9). The high-k dielectric material may include yttrium oxide, zirconium oxide, hafnium silicon oxide, hafnium oxide, zirconium oxide silicon, titanium oxide, cerium oxide, titanium cerium oxide, titanium cerium oxide, titanium cerium oxide or aluminum oxide.

The material of the gate electrode layer may be a metal. The metal material may include one or a combination of copper, tungsten, nickel, chromium, titanium, tantalum, and aluminum.

The gate structure 261 may further include an interface layer (not shown) surrounding the first channel layer 211 and the second channel layer 213 exposed by the bottom of the gate opening, where the gate dielectric layer may cover the interface layer.

The interface layer may be made of a material including silicon oxide. The interface layer may be formed using an oxidation process. The function of the interface layer may include repairing the surface of the first channel layer 211 and the second channel layer 213 at the bottom of the gate opening 260.

Correspondingly, the present disclosure also provides a semiconductor device fabricated by any of the above-mentioned embodiments. Referring to FIG. 14, the semiconductor device may include: the substrate 200, the fin on the substrate 200, where the fin may include the first channel layer 211 and the second channel layer 213 stacked along the normal direction of the surface of the semiconductor substrate; the gate structure 261 on the fin, where the gate structure 261 may surround the first channel layer 211 and the second channel layer 213; the first grooves in the fin on two sides of the gate structure 261, where the first channel layer 211 may be in the fin between the first grooves; the second grooves in the fin at the bottoms of the first grooves, where the second channel layer 213 may be in the fin between the second grooves, and the sidewall of the second channel layer 213 may be recessed with respect to the sidewall of the first channel layer 211; the doped source/drain layer 250 in the first grooves and the second grooves; the dielectric layer 240 over the substrate and the fin, where the dielectric layer 240 may cover the sidewalls of the gate structure 261, the sidewalls and the top surface of the doped source/drain layer 250, and may expose the top surface of the gate structure 261.

In one embodiment, the fin may further include the third channel layers stacked along the normal direction of the surface of the semiconductor substrate. The third channel layer may at the bottom of the second channel layer, and the sidewall of the third channel layer may be recessed with respect to the sidewall of the second channel layer. Additionally and optionally, the channel layers of the fin stacked along the normal direction of the substrate surface may further include an additional channel layer. The additional channel layer is disposed under the third channel layer and has recessed sidewalls with respect to corresponding sidewalls of the third channel layer.

In another embodiment, the fin may further include the plurality of the third channel layers stacked along the normal direction of the surface of the semiconductor substrate. The length of each third channel layer along the direction parallel to the substrate surface may be less than the length of the adjacent upper third channel layer or the adjacent upper second channel layer.

The substrate 200 may refer to the above-mentioned embodiments of the present disclosure, which may not be described in detail.

The structure, material and position of the gate structure 261 may refer to the above-mentioned embodiments of the present disclosure, which may not be described in detail.

The structure, material and position of the doped source/drain layer 250 may refer to the above-mentioned embodiments of the present disclosure, which may not be described in detail.

From the above-mentioned embodiments, it can be seen that the technical solution provided by the present disclosure may achieve at least the following beneficial effects.

In the fabrication method of the semiconductor device provided by the technical solution of the present disclosure, the first channel layer may be over the second channel layer, and the doped source/drain layer may be connected to the first channel layer and the sacrificial layer. In such way, when the source/drain voltage is applied to the doped source/drain layer, the source/drain voltage of the first channel layer may be greater than the source/drain voltage of the second channel layer. The sidewall of the second channel layer may be recessed with respect to the sidewall of the first channel layer exposed by the first grooves, so the size of the first channel layer between the first grooves may be greater than the size of the second channel layer between the second grooves. The smaller the channel size is, the smaller the threshold voltage for turning on the channel is. Therefore, the channel threshold voltage in the second channel layer may be less than the channel threshold voltage in the first channel layer. By appropriately adjusting the size of the second channel layer, the voltage difference between the source/drain voltage and the threshold voltage of the first channel layer may be equal to the voltage difference between the source/drain voltage and the threshold voltage of the second channel layer; and the channel carrier density in the first channel layer and the channel carrier density in the second channel layer may be same and the current density generated by each channel may be same, thereby improving the performance of the semiconductor device.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A semiconductor device, comprising:
   a substrate, a fin on the substrate, wherein the fin includes channel layers stacked along a normal direction of a substrate surface, wherein the channel layers includes a first channel layer and a second channel layer under the first channel layer, the second channel layer has recessed sidewalls with respect to corresponding sidewalls of the first channel layer, and a length of the second channel along a length direction of the fin is shorter than a length of the first channel along the length direction of the fin;
   a gate structure, disposed around each of the first channel layer and the second channel layer;
   an isolation layer on sidewalls of the gate structure between adjacent channel layers, wherein a sidewall of the isolation layer is coplanar with one of the sidewalls of the second channel layer; and a doped source/drain layer in the fin on two sides of the gate structure, wherein the doped source/drain layer is respectively connected to the second channel layer and the first channel layer.

2. The device according to claim 1, wherein:
the channel layers of the fin stacked along the normal direction of the substrate surface further includes a third channel layer, the third channel layer is disposed under the second channel layer and has recessed sidewalls with respect to corresponding sidewalls of the second channel layer.

3. The device according to claim 2, wherein:
the channel layers of the fin stacked along the normal direction of the substrate surface further includes an additional channel layer, the additional channel layer is disposed under the third channel layer and has recessed sidewalls with respect to corresponding sidewalls of the third channel layer.

4. The device according to claim 1, wherein:
a distance between one of the recessed sidewalls of the second channel layer and one of the sidewalls of the first channel layer is about 1 nm to about 4 nm.

5. The device according to claim 1, wherein:
a size of the second channel layer along a channel length direction is about 16 nm to about 38 nm.

6. The device according to claim 1, wherein:
a size of the first channel layer along a channel length direction is about 20 nm to about 44 nm.

7. The device according to claim 1, wherein:
the isolation layer is made of a material including silicon nitride, silicon oxynitride, silicon oxycarbide, silicon carbonitride or silicon oxycarbonitride.

8. The device according to claim 1, further comprising:
spacers formed on sidewalls of the gate structure, wherein the spacers have sidewalls coplanar with the sidewalls of the first channel layer.

9. The device according to claim 8, wherein:
the spacers are made of a material including silicon oxide, silicon nitride, silicon oxynitride, silicon oxycarbide, silicon carbonitride or silicon oxycarbonitride.

10. A semiconductor device, comprising:
a substrate,
a fin on the substrate, wherein the fin includes channel layers stacked along a normal direction of a substrate surface, wherein the channel layers includes a first channel layer and a second channel layer under the first channel layer, the second channel layer has recessed sidewalls with respect to corresponding sidewalls of the first channel layer;
a gate structure, disposed around each of the first channel layer and the second channel layer;
spacers formed on sidewalls of the gate structure, wherein the spacers have sidewalls coplanar with the sidewalls of the first channel layer; and
a doped source/drain layer in the fin on two sides of the gate structure, wherein the doped source/drain layer is respectively connected to the second channel layer and the first channel layer;
wherein the channel layers of the fin stacked along the normal direction of the substrate surface further includes a third channel layer, the third channel layer is disposed under the second channel layer and has recessed sidewalls with respect to corresponding sidewalls of the second channel layer.

11. The device according to claim 10, wherein:
the channel layers of the fin stacked along the normal direction of the substrate surface further includes an additional channel layer, the additional channel layer is disposed under the third channel layer and has recessed sidewalls with respect to corresponding sidewalls of the third channel layer.

12. The device according to claim 10, wherein:
a distance between one of the recessed sidewalls of the second channel layer and one of the sidewalls of the first channel layer is about 1 nm to about 4 nm.

13. The device according to claim 10, further comprising:
an isolation layer on sidewalls of the gate structure between adjacent channel layers, wherein a sidewall of the isolation layer is coplanar with one of the sidewalls of the second channel layer.

14. A semiconductor device, comprising:
a substrate, a fin on the substrate, wherein the fin includes channel layers stacked along a normal direction of a substrate surface, wherein the channel layers includes a first channel layer and a second channel layer under the first channel layer, and the second channel layer has recessed sidewalls with respect to corresponding sidewalls of the first channel layer;
a distance between one of the recessed sidewalls of the second channel layer and one of the sidewalls of the first channel layer is about 1 nm to about 4 nm;
a gate structure, disposed around each of the first channel layer and the second channel layer;
a doped source/drain layer in the fin on two sides of the gate structure, wherein the doped source/drain layer is respectively connected to the second channel layer and the first channel layer; and
an isolation layer on sidewalls of the gate structure between adjacent channel layers, wherein a sidewall of the isolation layer is coplanar with one of the sidewalls of the second channel layer.

15. The device according to claim 14, wherein:
the channel layers of the fin stacked along the normal direction of the substrate surface further includes a third channel layer, the third channel layer is disposed under the second channel layer and has recessed sidewalls with respect to corresponding sidewalls of the second channel layer.

16. The device according to claim 15, wherein:
the channel layers of the fin stacked along the normal direction of the substrate surface further includes an additional channel layer, the additional channel layer is disposed under the third channel layer and has recessed sidewalls with respect to corresponding sidewalls of the third channel layer.

17. The device according to claim 14, further comprising:
spacers formed on sidewalls of the gate structure, wherein the spacers have sidewalls coplanar with the sidewalls of the first channel layer.

* * * * *